United States Patent
Ashtiani et al.

(10) Patent No.: US 7,554,330 B2
(45) Date of Patent: Jun. 30, 2009

(54) METHOD FOR DETERMINING THE DETERIORATION OF A BATTERY

(75) Inventors: Cyrus Ashtiani, West Bloomfield, MI (US); Rick Lagerstrom, Ferndale, MI (US); Otmar Bitsche, Stuttgart (DE); Bernd Spier, Burgrieden (DE)

(73) Assignee: Daimler AG, Stuttgart (DE)

( * ) Notice: Subject to any disclaimer, the term of this patent is extended or adjusted under 35 U.S.C. 154(b) by 308 days.

(21) Appl. No.: 10/785,565

(22) Filed: Feb. 23, 2004

(65) Prior Publication Data

US 2005/0001625 A1 Jan. 6, 2005

Related U.S. Application Data

(60) Provisional application No. 60/449,811, filed on Feb. 24, 2003.

(51) Int. Cl.
*G01N 27/416* (2006.01)
*H02J 7/00* (2006.01)

(52) U.S. Cl. .................. 324/426; 320/132; 320/134

(58) Field of Classification Search .................. 324/426; 320/132
See application file for complete search history.

(56) References Cited

U.S. PATENT DOCUMENTS

| 5,663,628 | A | * | 9/1997 | Fujii | 362/183 |
| 5,703,469 | A | * | 12/1997 | Kinoshita | 340/636.19 |
| 5,739,670 | A | | 4/1998 | Brost et al. | 320/14 |
| 5,994,877 | A | * | 11/1999 | Seri et al. | 320/132 |
| 6,317,697 | B1 | * | 11/2001 | Yoshikawa et al. | 702/63 |

FOREIGN PATENT DOCUMENTS

| DE | 19849163 | 4/2000 |
| EP | 1278072 | 1/2003 |

* cited by examiner

*Primary Examiner*—Adolf Berhane
*Assistant Examiner*—Yalkew Fantu
(74) *Attorney, Agent, or Firm*—Davidson, Davidson & Kappel

(57) ABSTRACT

This objective is achieved according to the present invention in that in a method for determining the deterioration of a battery, the charge and discharge cycles of the battery are measured by number and depth of the charge/discharge. For each of the charge and discharge cycles, a characteristic deterioration value is determined on the basis of a deterioration curve that is characteristic of the specific battery type. These individual characteristic deterioration values are then summed up to obtain the deterioration of the battery.

18 Claims, 2 Drawing Sheets

METHOD FOR DETERMINING THE DETERIORATION OF A BATTERY

TECHNICAL FIELD OF THE INVENTION

The present invention is in the technical field of battery condition monitoring. In particular, it relates to a method for determining the deterioration of a battery, where charge and discharge cycles of the battery are measured by number and depth of the charge/discharge.

BACKGROUND OF THE INVENTION

For lead, nickel-metal hydride, or lithium-ion batteries, monitoring of the deterioration of the battery and thereby ultimately of the battery life is of great importance for functional endurance. Generally, the deterioration or battery life corresponds to the so-called "cycle life", which indicates the possible number of charge and discharge cycles of a battery before it stops functioning. Besides the absolute number of cycles, the type of the respective cycles, and here in particular the depth to which the battery is discharged or recharged, are of importance for this cycle life. Thus, for example, given a depth of discharge 100% per cycle, a battery has a cycle life of 80 cycles on a statistical average; however, given a depth of discharge 1% per cycle, it has a cycle life of 30,000 cycles. That is, for each depth of charge/discharge, there exists a number of cycles which is equivalent to the battery life. The total battery life is reached, for example, after 200,000 cycles at a depth of discharge (DOD) of 0.75%, or after 20,000 cycles at a DOD of 2.5%, etc.

Of the three battery systems mentioned at the outset, the lead battery has the shortest cycle life and the lowest cost of acquisition. Therefore, here is the greatest need for suitable monitoring or prognosis of the remaining cycle life.

Based on this knowledge, German Patent Application DE 198 49 163 A1 proposes an integrated storage device in batteries and accumulators, allowing storage and evaluation of data that is interesting for the service life of the batteries. Unfortunately, the above-mentioned document does not allow any conclusions about the actual mode of operation and especially not on the evaluation of the stored data so that no teaching is provided here that could be used by one skilled in the art to implement a method for determining the deterioration of a battery.

U.S. Pat. No. 5,739,670 proposes a method for diagnosing the condition of batteries. Using suitable counters, charge cycles and charge quantities as well as the duration of charge and discharge processes are measured and counted. The values determined in this manner are modified by an e-function via a correspondingly complex relationship in such a manner that the general condition of the battery can be calculated therefrom.

The procedure is comparatively complex, because a corresponding amount of data must be acquired and mathematically combined in complex form to be able to make the comparatively vague statements on the general condition of the battery.

A further possibility to determine the deterioration or deterioration condition of a battery lies in an active diagnosis. During this active diagnosis, the battery is charged or discharged with a predefined capacity. By measuring this active charge or discharge process, it is then possible to draw conclusions about the deterioration of the battery on the basis of the corresponding relationships that are known for the respective process. An active diagnosis method of this kind exemplified in European Patent Application EP 1 278 072 A1.

SUMMARY OF THE INVENTION

Starting from the above-mentioned field of the invention and the disadvantages of the conventional solutions according to the prior art mentioned there, it is now an object of the present invention to provide a method for determining the deterioration of a battery, allowing the deterioration of a battery to be securely and reliably determined, especially also in the applications having cycles which vary very much in terms of charge and discharge. Moreover, the intention is to make it possible to implement a deterioration indicator for the battery on this basis.

This objective is achieved according to the present invention in that in a method for determining the deterioration of a battery, the charge and discharge cycles of the battery are measured by number and depth of the charge/discharge. For each of the charge and discharge cycles, a characteristic deterioration value is determined on the basis of a deterioration curve that is characteristic of the specific battery type. These individual characteristic deterioration values are then summed up to obtain the deterioration of the battery.

For each battery type, such as for a lead accumulator, a nickel-metal hydride battery, or a lithium-ion battery, it is possible to determine a relationship between the depth of discharge and the cycle life. From this relationship which, at least on a statistical average, is characteristic of the specific battery type, can then be calculated a diagram which, in turn, exhibits a deterioration curve that is characteristic of the specific battery type. This deterioration curve can be represented, for example, in the form of percentages as a function of the depth of the charge or discharge cycles. A characteristic deterioration value is now derived from this characteristic curve for each charge or discharge cycle on the basis of its depth of charge or discharge. This characteristic deterioration value is then added to all characteristic deterioration values that have already been determined in previous cycles so that the sum of the characteristic deterioration values constantly increases over the battery life. Due to the direct relationship of the characteristic deterioration value and the depth of charge or discharge of the respective cycle via the deterioration curve, this value of the depth of charge or discharge, which plays a considerable part in the deterioration or life of the battery, is taken into account in a rapid and simple manner.

In order to determine the deterioration of the battery, it is then only necessary to consider the current sum of the characteristic deterioration values instead of performing complicated calculations. Over the life of the battery, the sum of the characteristic deterioration values will approach a value that represents a completely depleted battery. When expressing the individual characteristic deterioration values as percentages, this sum will then be 100% in the case of the depleted battery.

Thus, the extent to which the battery in question has already deteriorated as well as its remaining service life can be determined or read off at any time by a simple summation and consideration of the sum. The representation of the characteristic deterioration value, for example, as a percentage of the battery life already used is ideally suited to indicate the deterioration of the battery in a simple and efficient manner.

In one particularly beneficial embodiment of the method according to the present invention, each partial cycle of charging and each partial cycle of discharging is measured separately. The characteristic deterioration value is determined for each of the partial cycles, and the characteristic deterioration values for all partial cycles are summed up together.

This embodiment of the method according to the present invention is advantageous especially when the battery is not operated with regular cycles. For example, if individual discharge cycles occur one after the other without in-between recharging to the initial value of the discharge cycles, then a cycle-by-cycle consideration is comparatively inaccurate, because it cannot image this behavior.

In particular, in the case of heavy-duty batteries, such as are used to supply electric energy for traction purposes in motor vehicles, it is exactly these charge and discharge processes that play a special role, because here, discharge takes place in response to energy demand, and when energy is present, a corresponding charge process takes place without the vehicle observing the specific requirements of the batteries for ideal service life.

In order to nevertheless be able to determine the deterioration of a battery in a reliable and simple manner under these complex operating conditions, a cycle is advantageously defined, according to the above-mentioned embodiment of the present invention, as being composed of a plurality of partial cycles, which each represent different depths of charge or discharge. Usually, the partial cycles would be two half cycles, namely a first half cycle of discharging, followed by a second half cycle of charging.

In the case of the operation, for example, in a motor vehicle, which has already been mentioned above, the individual partial cycle of discharging is not necessarily followed by charging to a corresponding level, but greatly varying charge and discharge cycles are possible to occur. According to the embodiment of the present invention described here, each of the partial cycles and the depth of charge or discharge associated therewith is now considered separately, and a characteristic deterioration value is determined for each individual partial cycle on the basis of the deterioration curve. Thus, the deterioration can be determined in a very simple, rapid and effective manner, even in such a complex operation of a battery, by simply summing these characteristic deterioration values.

Besides the battery charge and discharge processes, which predominantly influence the service life, other factors, which also have a certain, but much smaller influence on the service life, can also be taken into account in a very simple manner. These can be determined by factors that are easy to determine, for example, by measurement, and be taken into account using a simple weighting factor which is mathematically combined with the characteristic deterioration value. Thus, for example, such a weighting factor, which is generally multiplicative, can be taken into account, that is, multiplied by the characteristic deterioration value, for every single of the determined characteristic deterioration values, before the determined characteristic deterioration value is put into the summation.

For example, the operating or ambient temperature of the battery or the size and direction of the charge or discharge current can be mentioned as a weighting factor of this kind. Of course, it is possible not only to take into account only one weighting factor, but also to mathematically combine a plurality of such weighting factors with the specific characteristic deterioration value.

In another very favorable embodiment of the method according to the present invention, only charge or discharge cycles are taken into account that have a capacity throughput above a predetermined limit.

This means that charges below this predetermined limit just as discharges below this predetermined limit are not considered. It is useful to set such a limit such that both the charging and the discharging of the battery with a capacity below this limit are exclusively from the double-layer capacity thereof so that such charging processes do not involve the active mass of the battery and, consequently, no chemical conversion thereof. In the case of the battery types described at the outset, the depths of charge or discharge that fall within the range of the double-layer capacity are usually of an order of magnitude of very much less than 1% of the maximum possible charge or discharge, i.e., of the battery capacity.

Due to the very simple and effective determination of the deterioration even for a complex operating strategy of the battery, a particularly convenient use of the method according to the present invention surely lies in the field of battery systems that are operated very irregularly in terms of charging and discharging, such as are used as battery systems in motor vehicles. In this context, the method can be used both for batteries for traction or propulsion purposes and for batteries for power supply to electric auxiliary components, such as navigation systems, vehicle electronics, and the like. Of course, use is also conceivable in the case of batteries that supply power to auxiliary devices and traction or propulsion devices simultaneously.

Further advantageous embodiments of the present invention follow from the remaining dependent claims and from the exemplary embodiments described below with reference to the Figures.

BRIEF DESCRIPTION OF THE FIGURES

In this context, the following Figures show schematically indicated characteristic curves, such as can be determined, for example, when using lead batteries.

Specifically.

DESCRIPTION OF THE PREFERRED EXEMPLARY EMBODIMENTS

Figure 1:
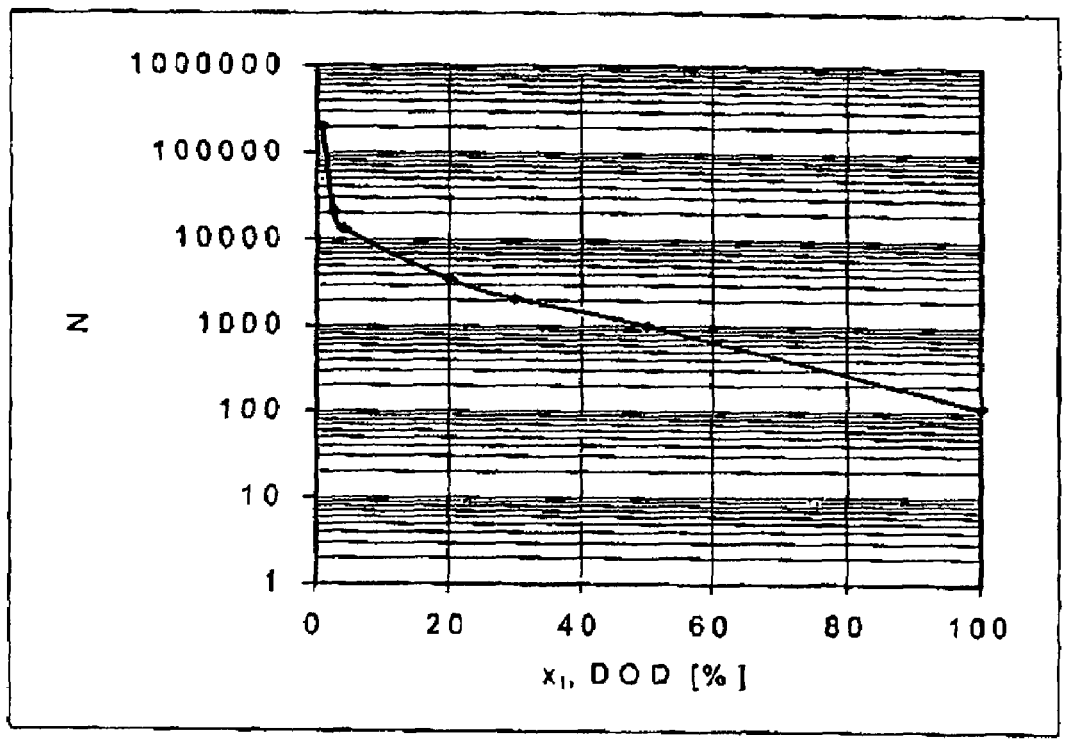
FIG. 1 shows an exemplary relationship between the cycle life (N) and the depth of discharge (DOD) of a lead battery.

In the following, the method according to the present invention will be explained in general terms by the example of a lead battery. For this purpose, FIG. 1 shows an approximately semi-logarithmic relationship between the depth of discharge (DOD) and the cycle life (N). A battery, as shown here, has a cycle life of, for example, about 100 cycles at a depth of discharge of 100%. However, at a depth of discharge of only 1%, the same battery has a cycle life of about 30,000 cycles.

Moreover, it can be seen from the plot in FIG. 1 that for different depths of discharge, the total battery life is reached after a different number of cycles. Consequently, this means that for each depth of discharge, there exists a number of cycles which is equivalent to the service life to the battery. Basically, it is now assumed that each cycle is composed of a first half cycle consisting of a discharge by $x_{dis}$, followed by a charge by $x_{cha}$. Thus, in each case, the same charge state which was present at the beginning of the cycle would be reached at the end of the cycle. In a realistic calculation, it must also be taken into account that the charging of the battery is not loss-free so that the capacity $x_{cha}$ that ultimately charged has to be charged is derived from the product of discharged capacity $X_{dis}$ and charging factor $L_F$.

$$x_{cha} = L_F \cdot x_{Dis} \qquad \text{(equation 1)}$$

In practice, however, the charge and discharge cycles often differ considerably because, in particular in the case of an application in motor vehicles, generally no regular cycles having a fixed depth of discharge are run through and, moreover, because the battery is usually not always fully charged. For this complex, but practical operation during which variable cycles occur, the cycles must therefore be defined differently. Equation (1) explained above is no longer valid for this complex battery operation, but for the individual charging and discharging steps (with index i), it therefore applies that:

$$x_{i,Cha} \neq L_F \cdot x_{i,Dis} \quad \text{(equation 2)}$$

Due to these conditions, in the method used here, the discharge and charge cycles are separately counted as partial cycles and, accordingly, also separately taken into account in the further calculations or evaluations.

For each value of the depth of discharge in percent $x_i$, a corresponding number of cycles $y_i$ of the respective cycle life N can be read off from the service life diagram of FIG. 1, which has already been explained at the outset. From these value pairs, a deterioration curve containing the value pairs $x_j$ and $z_j$ can then be calculated for half cycles. In this context, these value pairs are determined as follows:

$$x_j = x_i \quad \text{(equation 3a)}$$

$$z_j = 2 \cdot y_i \quad \text{(equation 3b)}$$

With that, it is then possible to calculate the characteristic deterioration values $Ak_i$ for the partial cycles having different depths of charge or discharge.

$$Ak_i = \frac{100\%}{z_i} \quad \text{(equation 4)}$$

Figure 2:
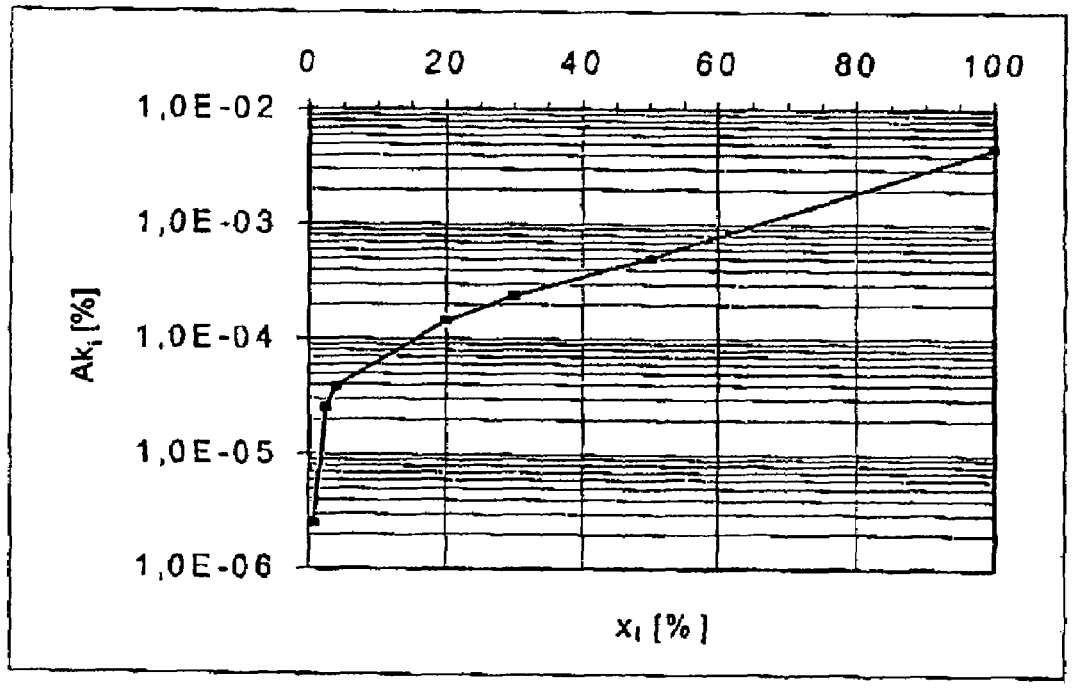
FIG. 2 depicts an exemplary deterioration curve of this battery.

This characteristic deterioration curve, which then arises as a relationship between the depth of charge or discharge $x_i$ in [%] and the characteristic deterioration value $Ak_i$ in [%] is plotted in the diagram of FIG. 2, again in a semi-logarithmic manner.

The process of charging or discharging and the associated depth can now be measured at the battery in a manner known per se, using a simple sensor system. For each of partial cycles $z_i$, a corresponding deterioration value $Ak_i$ that is characteristic of exactly this partial cycle $z_i$ is now derived from the depth of charge or discharge $x_i$ of the partial cycle on the basis of the deterioration curve in the diagram according to FIG. 2, the characteristic deterioration value being characteristic.

Through a simple, continuous summation of these characteristic deterioration values $Ak_i$ or of the individual numbers $n_i$ of all occurred characteristic deterioration values $Ak_i$, deterioration A of the battery can be determined as a percentage during operation. In this context, this deterioration A is derived from the following equation:

$$A = \sum_i n_i \cdot Ak_i \quad \text{(equation 5)}$$

In this context, $n_i$ represents the number of occurred partial cycles $z_i$ with their respectively corresponding depth of charge or discharge $x_i$.

Deterioration A determined by the summation is to be understood such that a deterioration of A=0% is to be treated as equivalent to a new battery, while a deterioration of A=100% means an already completely depleted battery. Hence, deterioration A indicates the percentage of the battery life that has already been used. Consequently, it is directly suited to indicate deterioration A, which is to be treated as equivalent to the battery life already used, or else, after a simple subtraction from 100%, to indicate remaining service life A', for which it then applies that: A'=100%−A.

Figure 3:
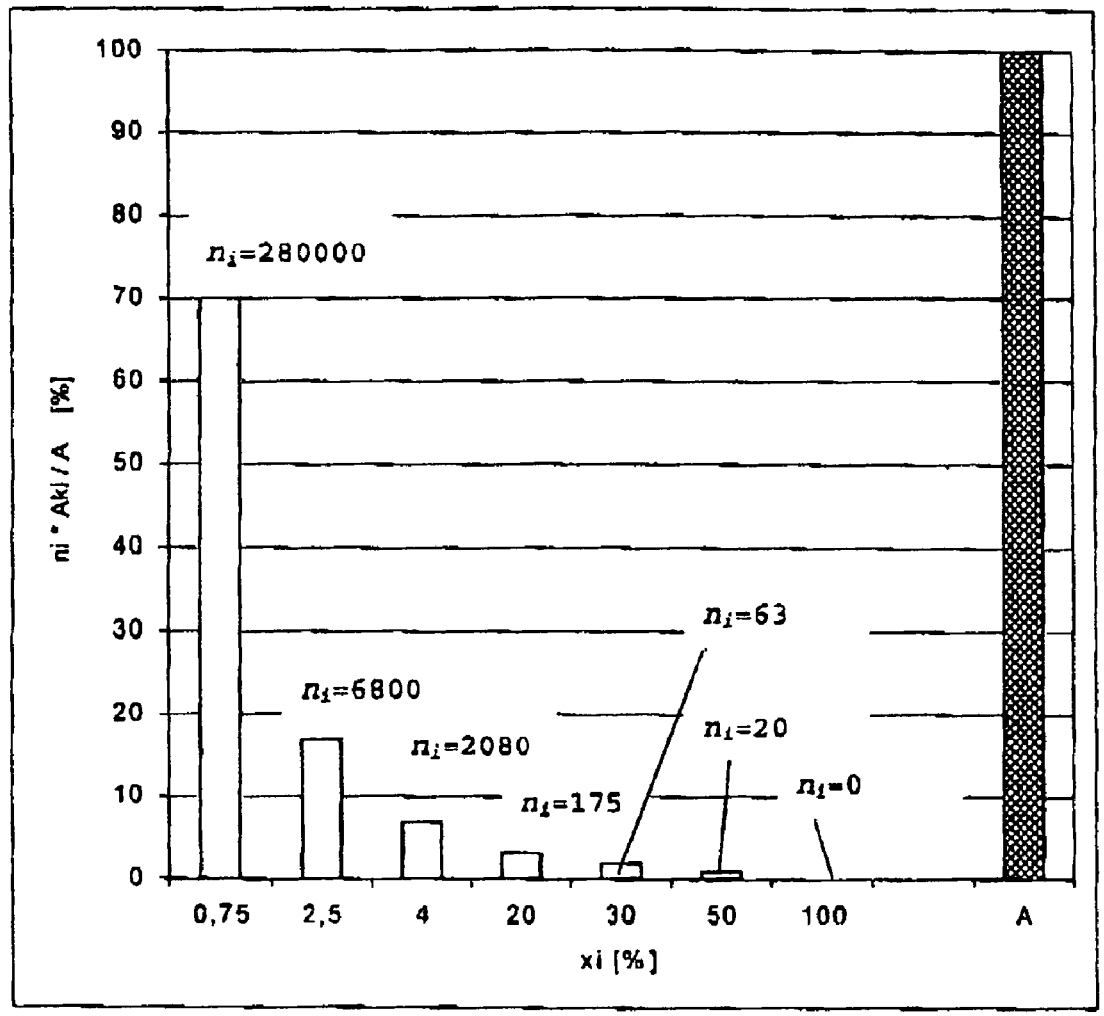
FIG. 3 is a diagram of an example of a battery at the end of its service life, with the proportions of individual partial cycles being represented in terms of the deterioration and their number.

A corresponding example of such a calculation is given by the plot shown in FIG. 3. In the example shown in FIG. 3, the battery is already completely depleted, as can be seen from the column of deterioration A shown on the right, which has reached the value of 100%. The further columns represent the sums (over $n_i$) of the individual partial cycles $z_i$ or characteristic deterioration values $Ak_i$ corresponding thereto with their respective depths of charge or discharge $x_i$, the height of the respectively corresponding bar indicating the proportion in percent of deterioration A. In the example chosen here, a number $n_i$=280,000 of partial cycles with a depth of charge or discharge $x_i$=0.75% occurred. This corresponds to a proportion of deterioration A of 70% of the total deterioration A that occurred. The next bar shows a number $n_i$=6,800 partial cycles at a depth of charge or discharge $x_i$=2.5%, which, in turn, represents a proportion of 17% of deterioration A. The further bars result at the further depths of charge or discharge $x_i$=4; 20; 30; 50; 100%, respectively, in analogous manner.

In addition to this comparatively simple embodiment, in which account is taken of the charge and discharge components which occur at the respective depths of charge and discharge $x_i$ and which are mainly relevant to the deterioration of a battery, it is also possible to optimize the method by entering further details into the calculation.

One of these details can be, for example, that capacity swings which occur during the charging or discharging of the battery and which are below a threshold value $x_{min}$ (DOD) to be defined in a battery-specific manner, are not counted as partial cycles. In this context, threshold value $x_{min}$ (DOD) has to be selected such that no volumetric work of the active masses in the battery occurs when the battery is charged or discharged by a capacity value that is smaller than this threshold value $x_{min}$ (DOD). The added or removed charge is provided in the battery only by charge exchange of the double-layer capacity. Since this charge exchange of the double-layer capacity has no effect on the service life or deterioration A of the battery, charge and discharge processes with a capacity smaller than $x_{min}$ (DOD) should not be taken into account in the consideration of deterioration A. Thus, these partial cycles are not processed so that here, no characteristic deterioration values are determined and put into the summation according to equation (5).

A further such influencing variable for optimizing the deterioration monitoring is the operating temperature T of the battery. The calculation of battery deterioration A can be refined further if temperature-dependent weighting factors $f_{i,T}$ are taken into account as well. Then, the calculation of deterioration A is given by the following equation:

$$A = \sum_T \sum_i n_{i,T} \cdot Ak_i \cdot f_{i,T} \quad \text{(equation 6)}$$

Comparably to these weighting factors $f_{i,T}$ based on the operating temperature of the battery, it is possible to use further weighting factors. In this context, it is particularly convenient and useful to take into account the influence of the current intensity by a further, possibly additional weighting factor $f_{i,I}$. Deterioration A is then calculated as follows:

$$A = \sum_I \sum_T \sum_i n_{i,T,I} \cdot Ak_i \cdot f_{i,T} \cdot f_{i,I} \quad \text{(equation 7)}$$

These three illustrated ways of refining the calculation of the deterioration using weighting factors $f_{i,T}$ and $f_{i,I}$ and by activating characteristic deterioration values $Ak_i$ only if the partial cycles include a charging or discharging with a capacity greater than threshold value $x_{min}(DOD)$, can be used both together and separately or in all conceivable combinations in order to determine the fundamental calculation of deterioration A in the manner explained here via the sum of characteristic deterioration values $Ak_i$.

In this context, both continuous functions [sic] of the weighting factors or deterioration curve can be used to represent the corresponding dependencies, i.e., the deterioration curve. However, it would also be possible to represent and use the dependencies in the form of approximated intervals, which could then be provided with class widths which are in each case adapted to the required accuracy of the calculation of deterioration A and to the specific battery type.

The second variant featuring the approximated intervals with adapted class width would be of particular importance especially for implementation in control units, such as in the complex control units of a motor vehicle, because this variant allows very rapid processing of the corresponding values while requiring a correspondingly small amount of computing and memory capacity in the control unit.

In the following, the relationships, which have so far been explained in a comparatively general manner, will be exemplified by two specific numerical examples.

NUMERICAL EXAMPLE 1

The following is a detailed description of the deterioration A of a lead battery, using a numerical example.

In this context, the cycle life curve of a lead battery having value pairs ($x_i$, $y_i$) is given analogously to the diagram in FIG. 1. In this context, these value pairs are found in columns 1 and 2 of Table 1 shown below. Partial cycles $z_i$ are determined from cycles $y_i$ in column 2 of Table 1 according to the relationship in equation (3). Characteristic deterioration value $Ak_i$, as is shown in column 4 of Table 1, can then be calculated from these partial cycles $z_i$ according to equation (4).

TABLE 1

| 1 | 2 | 3 | 4 |
|---|---|---|---|
| $x_i$ (DOD) | $y_i$ (cycles) | $z_i$ (partial cycles) | $Ak_i$ (characteristic deterioration value) |
| 100 | 120 | 240 | 0.416667 |
| 50 | 1200 | 2400 | 0.041667 |
| 30 | 2000 | 4000 | 0.025000 |
| 20 | 3500 | 7000 | 0.014286 |
| 10 | 12000 | 24000 | 0.004167 |
| 5 | 20000 | 40000 | 0.002500 |
| 3 | 50000 | 100000 | 0.001000 |

TABLE 2

| 1 | 2 | 3 |
|---|---|---|
| $x_i$ (DOD) | $n_i$ (number of partial cycles) | $A_i$ in [%] (deterioration component) |
| 100 | 7 | 2.92 |
| 50 | 11 | 0.46 |
| 30 | 63 | 1.58 |
| 20 | 168 | 2.40 |
| 10 | 805 | 3.35 |
| 5 | 5993 | 14.98 |
| 3 | 69201 | 69.20 |
| deterioration A in [%] | | 94.89 |

In Table 2, the number $n_i$ of partial cycles actually run through at each depth of charge or discharge $x_i$ is represented in column 2. Together with characteristic deterioration values $Ak_i$ for respective depth of charge or discharge $x_i$ from Table 1, the components A1 of deterioration A can thus be calculated according to the relationship in equation (5). These are represented in column 3 of Table 2. The sum of these components A1 then yields battery deterioration A, which, in the numerical example illustrated here, is A=94.89%.

In the calculation of deterioration A explained here by way of example, the intention was to choose a simple example for the purpose of illustration, without taking into account any weighting factors $f_i$.

NUMERICAL EXAMPLE 2

In the following, deterioration A of a nickel-metal hydride battery is exemplarily described with reference to a further, more detailed numerical example. This time, weighting factors $f_i$ were included in the exemplary calculation as well, without intending to limit the use of weighting factors $f_i$ to nickel-metal hydride batteries.

The numerical example 2 mentioned is now explained analogously to numerical example 1. Analogous to Table 1 already explained above, the corresponding values for $x_i$, $y_i$, $z_i$ and $Ak_i$ are listed in Table 3. They are derived analogously to the values in Table 1 using equations (3) and (4).

TABLE 3

| 1 | 2 | 3 | 4 |
|---|---|---|---|
| $x_i$ (DOD) | $Y_i$ (cycles) | $z_i$ (partial cycles) | $Ak_i$ (characteristic deterioration value) |
| 100 | 2493 | 4986 | 0.020056 |
| 50 | 29191 | 58382 | 0.001713 |
| 30 | 78090 | 156180 | 0.000640 |
| 25 | 99869 | 199738 | 0.000501 |
| 12 | 189324 | 378648 | 0.000264 |
| 5 | 267164 | 534328 | 0.000187 |
| 3 | 294789 | 589578 | 0.000170 |

Table 4 below serves to represent the influence of the temperature, the corresponding weighting factors $f_{i,T}$ being shown in columns 2 through 5 of Table 4 for selected temperatures T as a function of the depth of discharge $x_i$.

TABLE 4

| 1 $x_i$ (DOD) | 2 $f_{i,-25°\,C.}$ (factor) | 3 $f_{i,0°\,C.}$ (factor) | 4 $f_{i,25°\,C.}$ (factor) | 5 $f_{i,45°\,C.}$ (factor) |
|---|---|---|---|---|
| 100 | 0.795 | 0.904 | 1.000 | 4.695 |
| 50  | 0.816 | 0.915 | 1.000 | 4.505 |
| 30  | 0.844 | 0.930 | 1.000 | 4.428 |
| 25  | 0.858 | 0.937 | 1.000 | 4.409 |
| 12  | 0.949 | 0.985 | 1.000 | 4.360 |
| 5   | 1.194 | 1.113 | 1.000 | 4.333 |
| 3   | 1.474 | 1.260 | 1.000 | 4.325 |

TABLE 5

| 1 $x_i$ (DOD) | 2 $n_{i,-25°\,C.}$ (number) | 3 $n_{i,0°\,C.}$ (number) | 4 $n_{i,25°\,C.}$ (number) | 5 $n_{i,45°\,C.}$ (number) | 6 $A_i$ [%] (deterioration component) |
|---|---|---|---|---|---|
| 100 | 0   | 0     | 3     | 1     | 0.15 |
| 50  | 1   | 0     | 1     | 0     | 0.00 |
| 30  | 6   | 1     | 1     | 1     | 0.01 |
| 25  | 0   | 113   | 523   | 204   | 0.77 |
| 12  | 9   | 793   | 1899  | 508   | 1.29 |
| 5   | 13  | 13089 | 23904 | 10687 | 15.87 |
| 3   | 383 | 23056 | 78053 | 31068 | 41.05 |
| deterioration A in [%] | | | | | 59.14 |

In Table 5 shown above, analogous to the representation of number $n_i$ in Table 2 of numerical example 1, again, numbers $n_{i,T}$ of partial cylces $z_i$ are then indicated for the different temperatures T already taken into account in Table 4. In the numerical example shown here, components $A_i$ of deterioration A are then calculated using equation (6). They are represented in column 6 of Table 5. Thus, a deterioration condition of A=59.14% is calculated, which is yielded according to the principle explained at the outset, taking into account weighting factors $f_{i,T}$ which are dependent on depth of charge or discharge $x_i$ and temperature T.

In the same manner, the current dependence can also be integrated into the calculation of battery deterioration A, using a further weighting factor $f_{i,I}$. It would then be required to use a further table containing weighting factors $f_{i,I}$ as a function of temperature T and of current I. Table 5 would then have to be extended by one dimension, allowing representation of depth of charge or discharge $x_i$ in one direction and, in a second direction, temperature T, as well as current intensity I as a new dimension.

However, for use in control units, this is unproblematic because, upon completion of a partial cycle, battery deterioration A is immediately updated by adding the component $A_i$ of deterioration A that arises for the partial cycle, and because, consequently, there is no need to store large matrices for the partial cycle numbers.

What is claimed is:

1. A method for determining a deterioration of a battery, comprising:
measuring respective numbers of charge and discharge cycles at a plurality of depths of discharge of the battery;
determining a respective characteristic deterioration value for at least some of the charge and discharge cycles at each of the plurality of depths of discharge using a deterioration curve characteristic of a type of the battery; and
summing the determined characteristic deterioration values so as to obtain the deterioration of the battery;
wherein each respective charge and discharge cycle is a respective partial cycle, the measuring being performed so as to measure the respective partial cycle separately;
wherein the deterioration curve is a continuous function defining a dependence of each characteristic deterioration value on the depth of the respective charge or discharge for the battery type.

2. The method as recited in claim 1 wherein the deterioration curve includes approximated intervals having a class width adapted to the respective battery type, the deterioration curve defining a dependence of a respective characteristic deterioration value on the depth of the respective charge or discharge.

3. The method as recited in claim 1 wherein the deterioration curve is, in at least a section, adapted to a condition currently prevailing in a region of the battery using a weighting factor.

4. The method as recited in claim 3 wherein the weighting factor is dependent on a temperature.

5. The method as recited in claim 3 wherein the weighting factor is dependent on a direction and an intensity of a current of the respective charge or discharge cycle.

6. The method as recited in claim 4 wherein the weighting factor is dependent on a direction and an intensity of a current of the respective charge or discharge cycle.

7. The method as recited in claim 1 wherein the deterioration curve is a continuous function defining a dependence of each characteristic deterioration value on the depth of the respective charge or discharge for the battery type.

8. The method as recited in claim 1 wherein the deterioration curve includes approximated intervals having a class width adapted to the respective battery type, the deterioration curve defining a dependence of a respective characteristic deterioration value on the depth of the respective charge or discharge.

9. The method as recited in claim 1 wherein the deterioration curve is, in at least a section, adapted to a condition currently prevailing in a region of the battery using a weighting factor.

10. The method as recited in claim 9 wherein the weighting factor is dependent on a temperature.

11. The method as recited in claim 9 wherein the weighting factor is dependent on a direction and an intensity of a current of the respective charge or discharge cycle.

12. The method as recited in claim 10 wherein the weighting factor is dependent on a direction and an intensity of a current of the respective charge or discharge cycle.

13. The method as recited in claim 1 wherein the at least some of the charge and discharge cycles does not include charge or discharge cycles having a respective depth of charge or discharge below a predetermined limit.

14. The method as recited in claim 1 wherein the battery is configured to be used in a motor vehicle for supplying electric power to electronic auxiliary components.

15. The method as recited in claim 1 wherein the battery is configured to be used in a motor vehicle for supplying electric power to propulsion components.

16. The method as recited in claim 1 wherein the at least some of the charge and discharge cycles does not include charge or discharge cycles having a respective depth of charge or discharge below a predetermined limit.

17. The method as recited in claim 1 wherein the battery is configured to be used in a motor vehicle for supplying electric power to electronic auxiliary components.

18. The method as recited in claim 1 wherein the battery is configured to be used in a motor vehicle for supplying electric power to propulsion components.

* * * * *